United States Patent [19]
Titus et al.

[11] Patent Number: 5,136,720
[45] Date of Patent: Aug. 4, 1992

[54] MATRIXED MIXER

[75] Inventors: Ward S. Titus, Cambridge; Paul A. Bernkopf, Waltham, both of Mass.

[73] Assignee: Raytheon Company, Lexington, Mass.

[21] Appl. No.: 444,193

[22] Filed: Nov. 30, 1989

[51] Int. Cl.[5] ............................................. H04B 1/26
[52] U.S. Cl. .................................. 455/323; 455/319; 455/333; 333/138
[58] Field of Search ............... 455/318, 319, 323, 330, 455/333, 325, 326; 307/529; 328/133; 333/138

[56] References Cited

U.S. PATENT DOCUMENTS

| | | | |
|---|---|---|---|
| 3,248,653 | 4/1966 | Gabor | 455/318 |
| 4,369,522 | 1/1983 | Cerny, Jr. et al. | 455/333 |
| 4,662,000 | 4/1987 | Tajima et al. | 455/333 |
| 4,712,024 | 12/1987 | McGuire et al. | 455/189 |
| 4,752,746 | 6/1988 | Niclas | 333/277 |

OTHER PUBLICATIONS

Design and Performance of a 2–18 GHz Monolithic Matrix Amplifier, A. P. Chang, Millimeter-Wave Monolithic Circuits Symposium, pp. 139–141.

The Matrix Amplifier: A High-Gain Module for Multi-octave Frequency Bands, Karl B. Niclas and Ramon R. Pereira, IEEE Transactions on Microwave Theory and Techniques, vol. MTT-35, No. 3, Mar. 1987, pp. 296–306.

Primary Examiner—Reinhard J. Eisenzopf
Assistant Examiner—Edward Urban
Attorney, Agent, or Firm—Denis G. Maloney; Richard M. Sharkansky

[57] ABSTRACT

A matrix mixer includes an amplifier having a plurality of successively coupled transistors and a mixer stage comprised of a plurality of mixer elements successively connected by a common transmission line to output of the plurality of transistors of the amplifier. A matrix provides a circuit having improved gain characteristics and improved isolation between the local oscillator and the input RF signal terminals. Moreover, due to shared transmission lines, smaller circuit sizes is also provided.

15 Claims, 7 Drawing Sheets

MATRIXED MIXER

BACKGROUND OF THE INVENTION

This invention relates generally to radio frequency circuits and more particularly to frequency conversion circuits such as mixers and multipliers.

As is known in the art, frequency conversion circuits provide an output signal in response to an input signal having a frequency which is higher than or lower than the frequency of the input signal.

Radio frequency mixer circuits are widely employed in so-called superhetrodyne receivers which include in addition to the mixer an intermediate frequency (IF) amplifier tuned to a predetermined frequency provided from the mixer and a frequency detector which is fed the amplified signal from the IF amplifier. Generally, superhetrodyne receivers also include an input broadband amplifier which amplifies an input radio frequency signal typically received from an antenna, for example, and a local oscillator signal source. The received, amplified input signal and local oscillator signal are each fed to the mixer circuit to provide in response thereto an output signal including a pair of frequency components equal to the sum of and difference between the frequencies of the input signal and the local oscillator signal. Typically, the sum frequency component signal is filtered from the output signal and the difference frequency component signal is fed to the IF amplifier.

There are several types of mixers known in the art. One type of mixer is the so-called single-ended mixer which includes a non-linear device such as a transistor or a diode which is fed by the input signal and the local oscillator signal. In response, an output signal is provided having the sum and difference pair of frequencies $|\omega_{RF} \pm \omega_{LO}|$. One problem with this type of mixer is that the single-ended mixer provides undesired output frequency components such as the original input signal frequency $\omega_{RF}$, local oscillator signal frequency $\omega_{LO}$, and harmonics of the original input signals, as well as, products of the harmonics of the original input signals $(M\omega_{LO} \pm N\omega_{RF})$. Filtering or suppression of these signals is generally required. Moreover, with such a mixer, there is no isolation between the LO and RF signals which in certain applications is a problem.

A second type of mixers is a so-called singly balanced mixer which generally includes a pair of single-ended mixers and a 3 dB hybrid coupler. The inputs of the coupler are fed by the input signal and local oscillator signal and outputs of the hybrid are coupled to the input of each single-ended mixer. The output of the mixer elements are combined in a common junction to provide the output IF signal. One of the problems with singly-balanced mixers is the relative difficulty in fabricating the 3 dB hybrid coupler, and in particular, fabricating a 3 dB hybrid coupler which is broadband. Furthermore, it is difficult to fabricate a hybrid coupler as an integrated circuit.

A third type of mixer is the so-called doubly balanced mixer. The doubly-balanced mixer generally includes two singly balanced mixers each fed by the local oscillator signal having a 180° differential phase shift provided by a hybrid coupler or balun and one of a pair of input signals. The outputs of each balanced mixer are combined together by an IF hybrid coupler. One problem with doubly-balanced mixers is that the couplers or baluns are generally difficult to fabricate as monolithic integrated circuits. Accordingly, the double balanced mixer is not easily fabricated as a monolithic integrated circuit. A second problem with a double balanced mixer is the relatively narrow frequency bandwidth of operation due to the presence of couplers and the baluns.

One type of mixer which overcomes some of these problems as well as others is described in U.S. Pat. No. 4,662,000, by Tajima et al., and assigned to the assignee of the present invention. In the above-mentioned patent, a distributed mixer including a plurality of successively coupled dualgate field effect transistors is described.

The above-mentioned patent provides a circuit which overcomes many of the problems mentioned above concerning single-ended, balanced, and double balanced mixers and provides a technique in which relatively large bandwidth is achieved. However, the use of dual-gate field effect transistors typically increases the noise figure of a mixer, since dual-gate transistors tend to having higher noise figures than single gate transistors. In many applications, the higher noise figure of the mixer would not pose a serious problem. Moreover, in such applications, RF signals may be fed by low noise amplifiers to reduce the effect of the mixer noise figure on a final output, IF signal.

Nevertheless, it would be desirable to reduce the number of circuits employed in fabricating mixers and receivers. In particular, it would desirable to eliminate the LO amplifier, input RF amplifier, as well as, output IF amplifier or at least significantly reduced their requirements. Moreover, in certain applications, such as electronic warfare surveillance applications, it is necessary to prevent radiation of the LO signal through the antenna. This requirement necessitates high isolation between LO and RF terminals in particular in the direction LO to RF. In certain instances, isolation requirements beyond −90 dB may be required. Such an isolation specification is not easily achieved with known techniques.

A further problem with many known mixers is that such mixers tend to have low conversion efficiency. This characteristic increases the power requirement for the LO signal, source, and IF amplifiers. Again, reduction of such requirements would be desirable.

SUMMARY OF THE INVENTION

In accordance with the present invention, a radio frequency, frequency conversion circuit, having a first input terminal and an output terminal includes a first propagation network having a first end coupled to the input terminal and a first plurality of field effect transistors having input electrodes and output electrodes, with the input electrodes being successively coupled by said first propagation network. A second propagation network successively couples the output electrodes of said first plurality of field effect transistors. A first plurality of non-linear elements each having an input electrode and an output electrode have the input electrodes thereof successively coupled by the second propagation network, and a third propagation network having a first end connected to the output terminal successively couples said output electrodes of each of the plurality of non-linear elements to the output terminal. With this particular arrangement, the first plurality of field effect transistors in combination with the first propagation network and the second propagation network provide a distributed amplifier which may be used to amplify an input RF signal fed thereto. The plurality of non-linear elements being coupled between the second propagation network and the third propagation network form provide a distributed frequency conversion circuit matrixed with the distributed amplifier. By sharing the second propagation network, the size and hence cost of the circuit is reduced while permitting one of the input signals to be amplified by the amplifier. Furthermore, elimination of a propagation network which results by having the pluralities of transistors and non-linear elements share a common line, reduces losses and improves noise figure.

In accordance with a further aspect of the invention, the circuit includes a second input terminal coupled to the second input transmission line, over which a local oscillator signal is fed. With such an arrangement, a mixer circuit is provided having all of the advantages described above.

Further, if the inherent reactances of each one of the field effect transistors and non-linear elements of the circuit are taken into consideration when designing the propagation networks of the circuit, a broadband RF matrixed mixer circuit is provided using distributed circuit principles.

In accordance with a still further aspect of the present invention, a matrixed mixer has first and second input terminals and an output terminal, and includes an input propagation network having a first end coupled to a first one of the input terminal and a first plurality of field effect transistors having input electrodes and output electrodes, with the input electrodes being successively coupled by said input propagation network. An intermediate propagation network successively couples the output electrodes of said first plurality of field effect transistors. The mixer further includes a second plurality of field effect transistors each having an input electrode and an output electrode, and a second input propagation network having a first end coupled to the second input terminal. The input electrodes of the second plurality of FETS are successively coupled by the second input propagation network. The output electrodes of the second plurality of field effect transistors are also successively coupled by the intermediate propagation network. A first plurality of non-linear elements each having an input electrode and an output electrode have the input electrodes thereof successively coupled by the intermediate propagation network. A output propagation network having a first end connected to the output terminal is used to successively couple the output electrodes of the plurality of non-linear elements to the output terminal. With this particular arrangement, a matrix mixer having an amplifier for the input RF signal and an amplifier for the input LO signal is provided. This particular arrangement will provide the advantages mentioned above for the prior arrangement and, furthermore, provides relatively good isolation between the RF and LO signal terminals.

In accordance with a still further aspect of the present invention, each one of the input signals r.f. and LO are fed through at least two matrixed stages of distributed amplification. With this particular arrangement, amplification of the input signals is significantly increased since each input signal is amplified by action of the additive gain associated with the distributed portions of the corresponding amplifier, as well as, the multiplicative gain resulting from matrixing at least a pair of said amplifier stages.

In accordance with a still further aspect of the present invention, a matrixed mixer includes a first matrixed amplifier comprised of at least one stage of distributed amplification for an input RF signal, and a second, amplifier comprised of at least one stage of distributed amplification for a local oscillator signal. The mixer further includes a plurality of non-linear elements, such as dual-gate field effect transistors, each having first and second input electrodes and an output electrode. An output propagation network from the last stage of each one of the matrixed amplifiers is used to successively couple each correspondingly one of said input electrodes of the plurality of dual-gate field effect transistors. A third output propagation network is used to successively couple each output electrode of the plurality of dual-gate field effect transistors to the output terminal. With this particular arrangement, RF and LO matrixed preamplifiers may be optimized for low noise and high power operation. Matrixing such a pair of amplifiers with a dual-gate transistor mixer will improve LO to RF isolation due to the high gate to gate isolation of the dual-gate FET. Moreover, the noise figure of such a circuit will be relatively good compared to prior dual-gate based mixers, since each pre-amplifier stage may be designed for low noise operation.

In a preferred embodiment, each of said amplifier stages is a matrix amplifier to increase gain and power impartial to each signal and thus improve conversion efficiency of the mixer.

In accordance with a still further aspect of the present invention, a matrixed mixer includes an input propagation network, and a plurality of non-linear elements having input electrodes successively coupled by the input propagation network. An intermediate propagation network is provided to successively couple output electrodes of the non-linear elements. The mixer further includes second plurality of field effect transistors, have the input electrodes thereof successively coupled by the intermediate propagation network. An output propagation network comprised of a plurality of phase advance line sections is used to successively couple output electrodes of the plurality of field effect transistors. With this particular arrangement, by selection of the gains of the second plurality of field effect transistors as well as the bandwidth characteristics of the intermediate and output propagation networks, a distributed mixer matrixed with a transversal filter is provided. Such an arrangement will provide high suppression of spurious signals and reduce harmonic saturation of succeeding linear circuits.

In accordance with a still further aspect of the present invention, a double down-converter includes a first input propagation network and a second input propagation network. A first plurality of non-linear elements have input electrodes thereof successively coupled by the first input propagation network, and the output electrodes thereof successively coupled by the second input propagation network. A second plurality of non-linear elements has input electrodes thereof successively coupled by the second input propagation network and has output electrodes thereof successively coupled by a third or output propagation network. An input RF signal is fed to the first input propagation network. A first local oscillator signal is fed to the first input terminal of the network and a second local oscillator signal is fed to a second input terminal of the network. A pair of different IF conversions are provided. With such an arrangement, a circuit is provided having multiple frequency conversions which can be an up conversion or a down conversion or some combination thereof. That is, such a circuit would be desirable in certain receivers to reduce spurious IF responses. This is also useful in receivers requiring a relatively low IF frequency, since conversion to a low IF frequency is facilitated by multiple down conversions rather than a relatively large single down conversion. This arrangement also enables amplification between down conversions by matrixing an amplifier between the first and second pluralities of non-linear elements.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
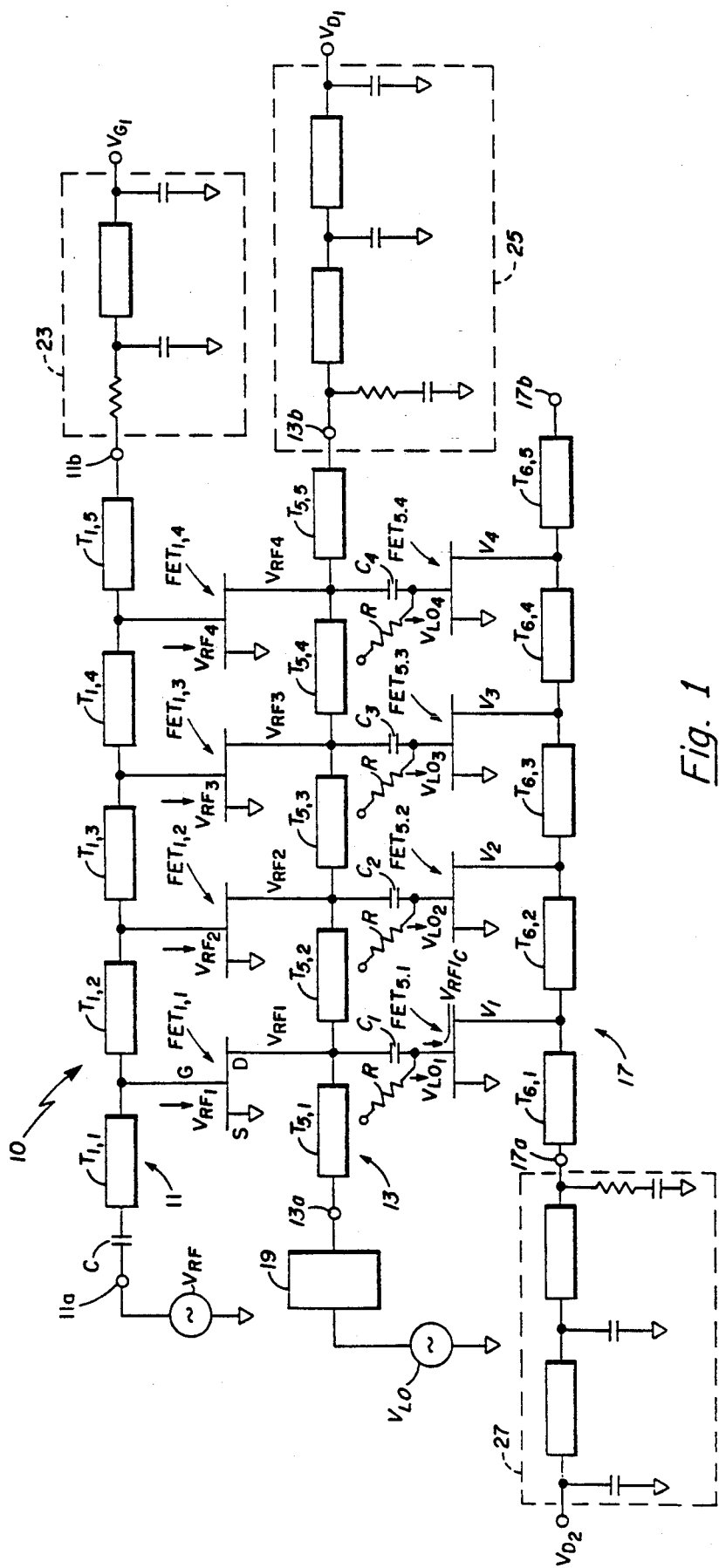
FIG. 1 is a schematic representation of a matrix mixer in accordance with a first aspect of the present invention.

Referring now to FIG. 1, a matrix frequency conversion circuit, here a mixer 10 is shown to include an input propagation network 11 here comprised of transmission line sections $T_{1,1}$–$T_{1,5}$. Here each one of said transmission line sections and all transmission line sections to be described herein, unless otherwise noted, are microstrip transmission line sections. Such sections connected together provide a microstrip transmission line. However, other types of propagation line media such as coplanar waveguide and, as well as, lumped element propagation networks, for example, may alternatively be used. Moreover, each one of the transistors described herein are metal semiconductor field effect transistors (MESFET). Other transistor types may alternatively be used. Such circuits to be described are also preferrable, provided as monolithic microwave integrated circuits on semiconductor material, such as gallium arsenide or other suitable semiconductor materials.

One end of input propagation network 11, that is one end of transmission line section $T_{1,1}$ is coupled through a D.C. blocking capacitor C to an input terminal 11a which is fed an input signal RF from source $V_{RF}$. The succeeding end of the input propagation network 11 here at transmission line section $T_{1,5}$ is coupled to a termination/bias terminal 11b of the circuit 10. Terminal 11b is connected to a conventional gate bias/RF termination network 23 as shown, which is here a ladder network. Such a network is described in U.S. Pat. No. 4,662,000 incorporated herein by reference. Other gate bias arrangements, such as external biasing may alternatively be used. The mixer 10 is shown to further include a plurality of field effect transistors FET 1,1–FET 1,4 having gate electrodes (G), drain electrodes (D), and source electrodes (S). Generally, the gate electrodes are successively coupled by the input propagation network 11 and the source electrodes are connected to a common RF and D.C. reference potential.

The mixer 10 further includes an intermediate propagation network 13 comprised of transmission line sections $T_{5,1}$–$T_{5,5}$, having a first end of here transmission line section $T_{5,1}$ connected to terminal 13a and a succeeding end, here transmission line section $T_{5,5}$ connected to terminal 13b, as shown. If circuit 10 were a frequency multiplier (not shown) then said intermediate transmission line 13 would be terminated at terminals 13a and 13b in matching load impedances to prevent reflections as is known in the art. For the arrangement shown here terminal 13a is coupled to a filter 19 which prevents reflections on line 13 and feed-through from line 13 but which permits an LO signal to be coupled to intermediate line 13. Further, at terminal 13b drain bias is also fed to the transistors FET 1,1 to FET 1,4. A circuit which provides drain bias and termination is shown and is a conventional ladder network 25 of the type referred to in the above U.S. Patent, for example.

The matrix mixer is shown to further include a second plurality of field effect transistors FET 5,1–FET 5,4 which here are operated in a non-linear mode. Propagation network 13 also provides an input propagation network to successively couple input electrodes, here gates, of the non-linear elements FET 5,1–FET 5,4 as shown. The non-linear elements FET 5,1–FET 5,4 are here metal semiconductor field effect transistors although other types of non-linear elements, such as diodes, may alternatively be used. The non-linear elements FET 5,1–FET 5,4 in addition to having input electrodes or gate electrodes successively coupled by the intermediate line 13, have output electrodes or drain electrodes successively coupled by third propagation network 17 comprised of transmission line sections $T_{6,1}$–$T_{6,5}$ which is coupled between terminals 17a and 17b, as shown. Gate bias is provided to the second plurality of transistors by disposing D.C. blocking capacitors $C_1$–$C_4$ between the gate electrodes and the intermediate propagation network 13, and pull-up resistors R between a gate bias line (not shown) and the gate electrode as shown. Here the capacitors are relatively large valve capacitors to provide a minimal change in input impedance to each transistor.

Here terminal 17b provides the output or IF port for the mixer 10, and terminal 17a is terminated in a matching characteristic impedance provided by drain bias network 27, as is generally known from the above patent.

Alternative bias arrangements are described in U.S. Pat. No. 5,021,743 by Chu et al. incorporated herein by reference and assigned to the assignee of the present invention. Provision would be made to insure that each stage is biased to operate in its intended mode. That is FET 1,1–FET 1,4 are generally biased to operate in a linear application mode, whereas FET 5,1–FET 5,4 are biased to operate nonlinearly and thus maximize mixing of the pair of signals. Alternatively, if the circuit is a multiplier, then FET 1,1–FET 1,4 are biased non-linearly to generate harmonics of the input signal.

Each of the transmission line sections $T_{1,1}-T_{1,5}$ have a characteristic impedance in accordance with the intrinsic reactance between gate and source electrodes of the field effect transistors FET 1,1 to FET 1,5 to provide a network having a requisite input impedance characteristic as is commonly known for distributed amplifiers and as explained in the above-mentioned patent. Similarly, transmission line 13 comprises transmission line sections $T_{5,1}-T_{5,5}$ has the characteristic impedance thereof selected in accordance with the input capacitance of transistors FET 5,1-FET 5,4 and the output impedance of transistors FET 1,1 FET 1,4 to provide a network having an overall selected characteristic impedance. The last or here third propagation network 17 also has transmission line sections $T_{6,1}-T_{6,5}$ having a characteristic impedance in accordance with the reactance of the output electrodes of FET 5,1-FET 5,4 to provide a network having a requisite output impedance characteristic. Such arrangement provides a broadband matrix mixer 10.

In operation, an input signal here $V_{RF}$ is fed to the mixer 10. Such signal, for example, may be a received signal from an antenna of a radar system (not shown). Signal $V_{RF}$ is fed to terminal 11a and propagates along transmission lines $T_{1,1}-T_{1,5}$, towards terminal 11b where a residual portion is absorbed to prevent reflection of the signal back to the input. Successive portions of said signal $V_{RF1}-V_{RF4}$ are coupled from the network 11 by the gate electrodes of field effect transistors FET 1,1-FET 1,4. Amplified versions of said successively coupled signals appear at the outputs or drain electrodes of each of the transistors FET 1,1 FET 1,4, as is commonly known in the distributed amplifier art and are coupled to the intermediate propagation network 13 inducting sections $T_{5,1}-T_{5,4}$.

Figure 1A:
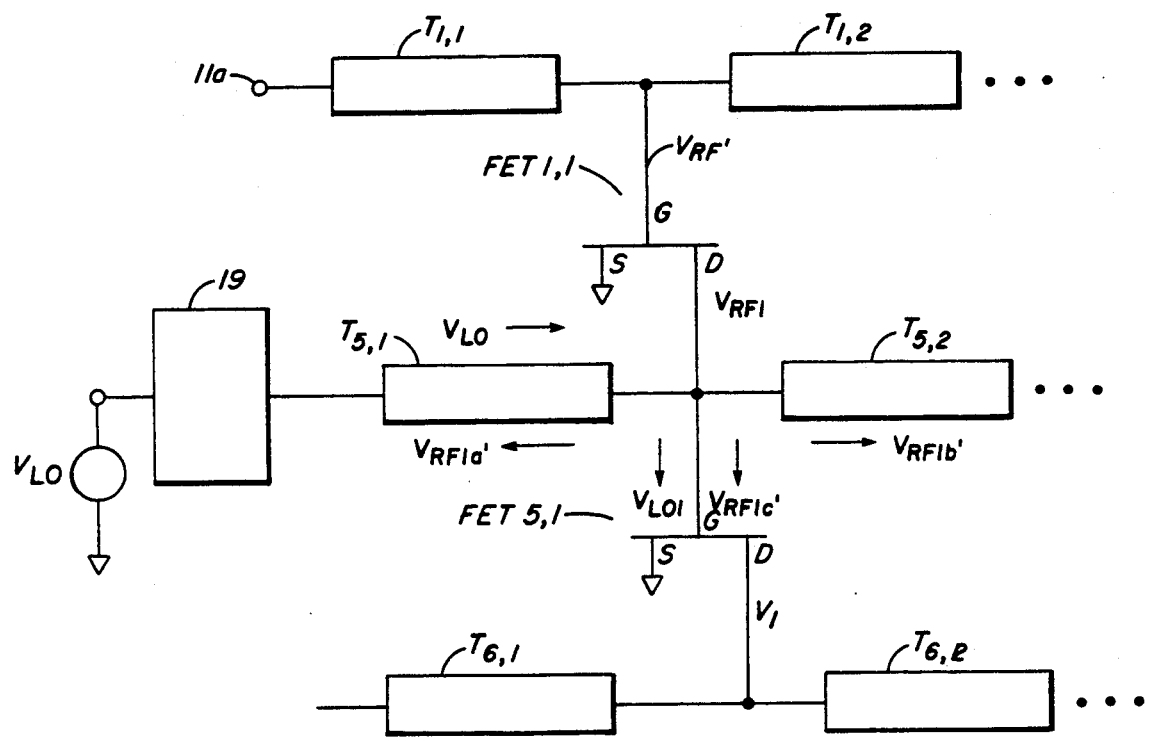
FIG. 1A is a schematic of a portion of the circuit of FIG. 1.

Referring also to FIG. 1A, signal portion $V_{RF1}'$ here representative of each one of said signal portions $V_{RF1}'-V_{RF4}'$ (FIG. 1) propagates along line 13 in one of three directions. A first portion $V_{RF1a}'$ of said signal $V_{RF1}'$ propagates towards terminal 13a, a second portion $V_{RF1b}'$ of said signal propagates towards terminal 13b, and a third portion $V_{RF1c}'$ of said signal is fed to one of the matrixed mixer elements FET 5,1-FET 5,4 here the gate of element FET 5,1. A second input signal here a local oscillator signal $V_{LO}$ provided typically from a tunable local oscillator provided in the system (not shown) is fed through filter 19 which isolates the local oscillator from the signal $V_{RF}$ and is coupled to terminal 13a of circuit 10, as shown. Such local oscillator signal $V_{LO}$ also propagates along transmission lines $T_{5,1}-T_{5,5}$ towards terminal 13b where it is terminated in a characteristic impedance provided by the network 25 (FIG. 1). Successive portions of said signal $V_{LO1}-V_{LO4}$ are also coupled to the matrix mixer elements FET 5,1-FET 5,4 as are signal portions $V_{RF1}-V_{RF4}$. Such pairs of signals ($V_{RF1c}$, $V_{LO1}$ and so forth) are fed to the respective non-linear elements FET 5,1-FET 5,4 and produce output signals $V_1-V_4$ having signal frequency components $|N\omega_{RF}+M\omega_{LO}|$, where M, N are integers between 1 and infinity. Such signal portion $V_1-V_4$ are coupled to the output terminal 17b by a third propagation network 17 comprised of transmission line sections $T_{6,1}-T_{6,5}$, as shown.

With the arrangement shown in FIG. 1, the input signal $V_{RF}$ is amplified by the field effect transistors FET 1,1-FET 1,4, thereby increasing the input signal level fed to the mixer elements FET 5,1-FET 5,4, and thus increasing the conversion efficiency of the matrix mixer 10. Moreover, the presence of the single-gate electrode field effect transistors FET 1,1-FET 1,4 between the network 13 and the input terminal 12 provides a high degree of isolation of the local oscillator signal $V_{LO}$ from the input terminal 12 of the network 10, thereby preventing radiation of a significant portion of the LO signal.

Figure 2:
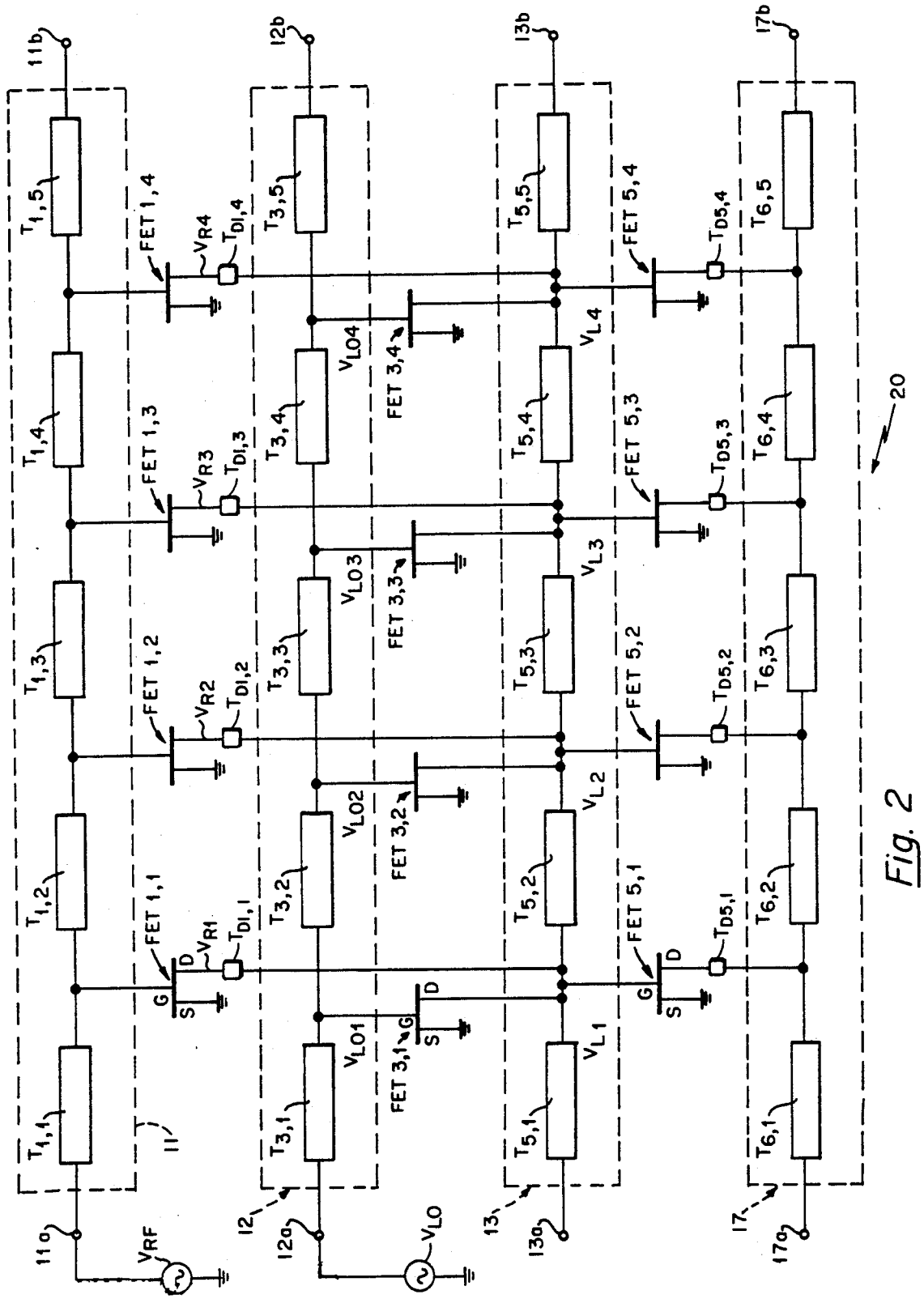
FIG. 2 is a schematic representation of a matrix mixer having RF and LO preamplification in accordance with a further aspect of the present invention.

Referring now to FIG. 2, an alternate embodiment of a matrix mixer 20 is shown to include the input propagation network 11 coupled between input terminal 11a and terminal 11b, the first plurality of field effect transistors FET 1,1-FET 1,4, the intermediate propagation network 13 coupled between terminals 13a and 13b comprised of transmission line sections $T_{5,1}-T_{5,5}$, the plurality of non-linear elements FET 5,1-FET 5,4, and the output propagation network 17 comprised of transmission line sections $T_{6,1}-T_{6,5}$ coupled between terminals 17a and 17b, as shown and generally described in conjunction with FIG. 1. Matrixed mixer 20 here further includes a LO preamplifier comprised of a second input propagation network 12 coupled between terminals 12a and 12b and comprised of transmission line sections $T_{3,1}-T_{3,5}$, and a second plurality of field effect transistors here FET 3,1-FET 3,4 having gate electrodes (G) successively coupled by said transmission line sections $T_{3,1}-T_{3,4}$ between the terminals 12a and 12b, as shown. The transistors FET 3,1-FET 3,4 also have drain electrodes (D) or output electrodes successively coupled by the intermediate propagation network 13 as also shown. Operation of mixer 20 is similar to that described above in conjunction with FIG. 1 with respect to the input voltage signal $V_{RF}$. Here, however, the input voltage signal $V_{LO}$ is also distributively amplified by the field effect transistors FET 3,1-FET 3,4 and matrixedly fed to the mixer elements FET 5,1-FET 5,4. Thus, voltage signal $V_{LO}$ is fed to terminal 12a and propagates along transmission line $T_{3,1}-T_{3,5}$ with successive portions of said signals $V_{LO1}-V_{104}$ being fed to the gate electrodes of transistors FET 3,1-FET 3,4 producing output signals $V_{L1}-V_{L4}$ which are successively coupled by the propagation network 13. Thus signals $V_{L1}-V_{L4}$ and $V_{R1}-V_{R4}$ are fed to the plurality of matrix mixer elements FET 5,1-FET 5,4 and provide the output signals $V_1-V_4$, as otherwise generally described in conjunction with FIGS. 1 and 1A. Generally, the output electrodes of transistors FET 1,1 -FET 1,4 are connected with those of FET 3,1-FET 3,4 are at common junctions along the intermediate propagation network 13.

The advantages of the circuit described in conjunction with FIG. 2 in addition to the advantages achieved by the circuit shown in FIG. 1 are that the local oscillator signal $V_{LO}$ is also amplified by the mixer, thus increasing the conversion efficiency of the mixer particularly for low level input ($V_{RF}$) signals. This arrangement also provides relatively high RF to LO isolation and alleviates the need for a filter 19 at the input of the local oscillator terminal 13a as shown in the embodiment of FIG. 1.

In general, all of the embodiments described herein have optional drain electrode transmission line sections $T_{D1,1}-T_{D1,4}$ and $T_{D5,1}-T_{D5,4}$, as shown which facilitates circuit layout and optimizes electrical characteristics as is generally known. Such lines, however, are referred to only in conjunction with FIG. 2.

Figure 3:
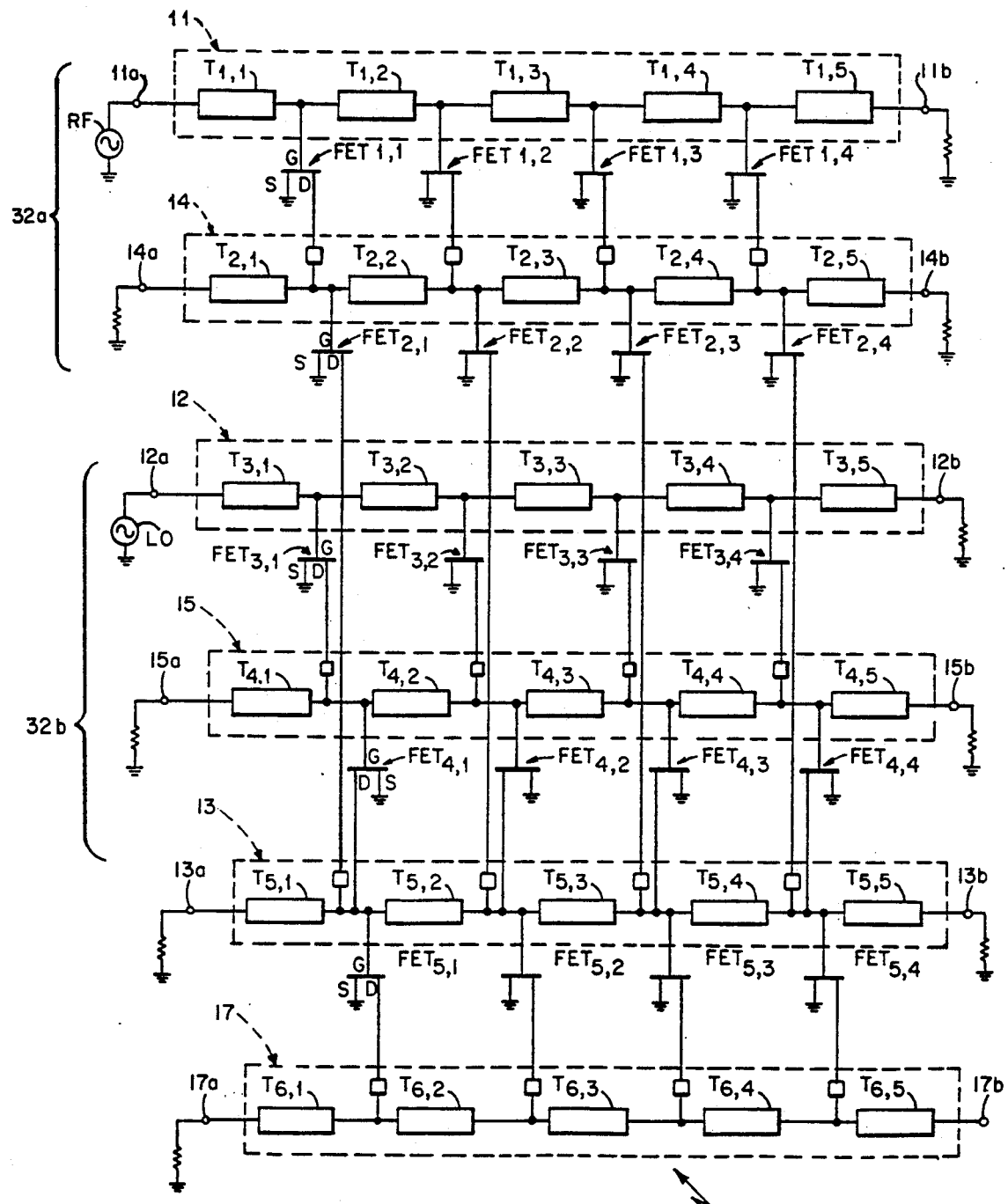
FIG. 3 is a schematic representation of a matrix mixer having multiple amplification stages for both RF and LO signals in accordance with a still further aspect of the present invention.

Referring now to FIG. 3, a further embodiment of the matrix mixer 30 is shown to include here two stages of input signal ($V_{RF}$) distributed/matrix amplification and two stages of input signal ($V_{LO}$) distributed/matrix amplification. The mixer 30 includes the input propagation network 11, first plurality of field effect transistors FET 1,1-FET 1,4, the second plurality of field effect transistors FET 3,1-FET 3,4, second input propagation network 12, the intermediate propagation network 13, matrix mixer elements FET 5,1-FET 5,5, and the output propagation network 17, as generally described in conjunction with FIGS. 1 and 2. Here an additional stage of amplification is provided by transistors FET 2,1-FET 2,4 having input or gate electrodes successively coupled by a second intermediate propagation network 14 comprised of transmission line sections $T_{2,1}$-$T_{2,5}$. A second stage of local oscillator signal amplification ($V_{LO}$) is provided by field effect transistors FET 4,1-FET 4,4 which have gate electrodes successively connected by a third intermediate propagation network 15 comprised of transmission line sections $T_{4,1}$-$T_{4,4}$ as also shown. The output electrodes of the second stage of the RF amplifier, here the drain electrodes of transistors FET 2,1-FET 2,4, as well as, the output electrodes of the second stage of the local oscillator amplifier, that is the drain electrodes of transistors FET 4,1-FET 4,4 are coupled to the first intermediate transmission line network 13 comprised of transmission line sections $T_{5,1}$-$T_{5,5}$ as generally described in conjunction with FIG. 1.

Here operation of the mixer 30 is substantially identical to that described in conjunction with FIG. 2, except that each input signal $V_{RF}$ and $V_{LO}$ is amplified both by the additive gain provided by the distributed amplifiers and the multiplicative gain provided by matrixing the pair of distributed amplifiers.

Matrixed distributed amplifiers are described in an article entitled "The Matrix Amplifier High Gain Module for Multioctive Frequency Bands" by Niclas et al., IEEE Transactions on Microwave Theory and Techniques, MTT Vol. 35, No. 3, March 1987, pp. 296-306.

Mixer 30 here thus includes a pair of matrixed amplifiers 32a, 32b, as shown. Amplifier 32a is used to provide multiplicative and additive gain to signal $V_{RF}$, whereas amplifier 32b is used to provide multiplicative and additive gain to signal $V_{LO}$. Amplifiers 32a, 32b are connected to a common propagation network 13 and matrixed with the non-linear elements FET 5,1-FET 5,4 to provide the mixer 30 as shown.

Figure 4:
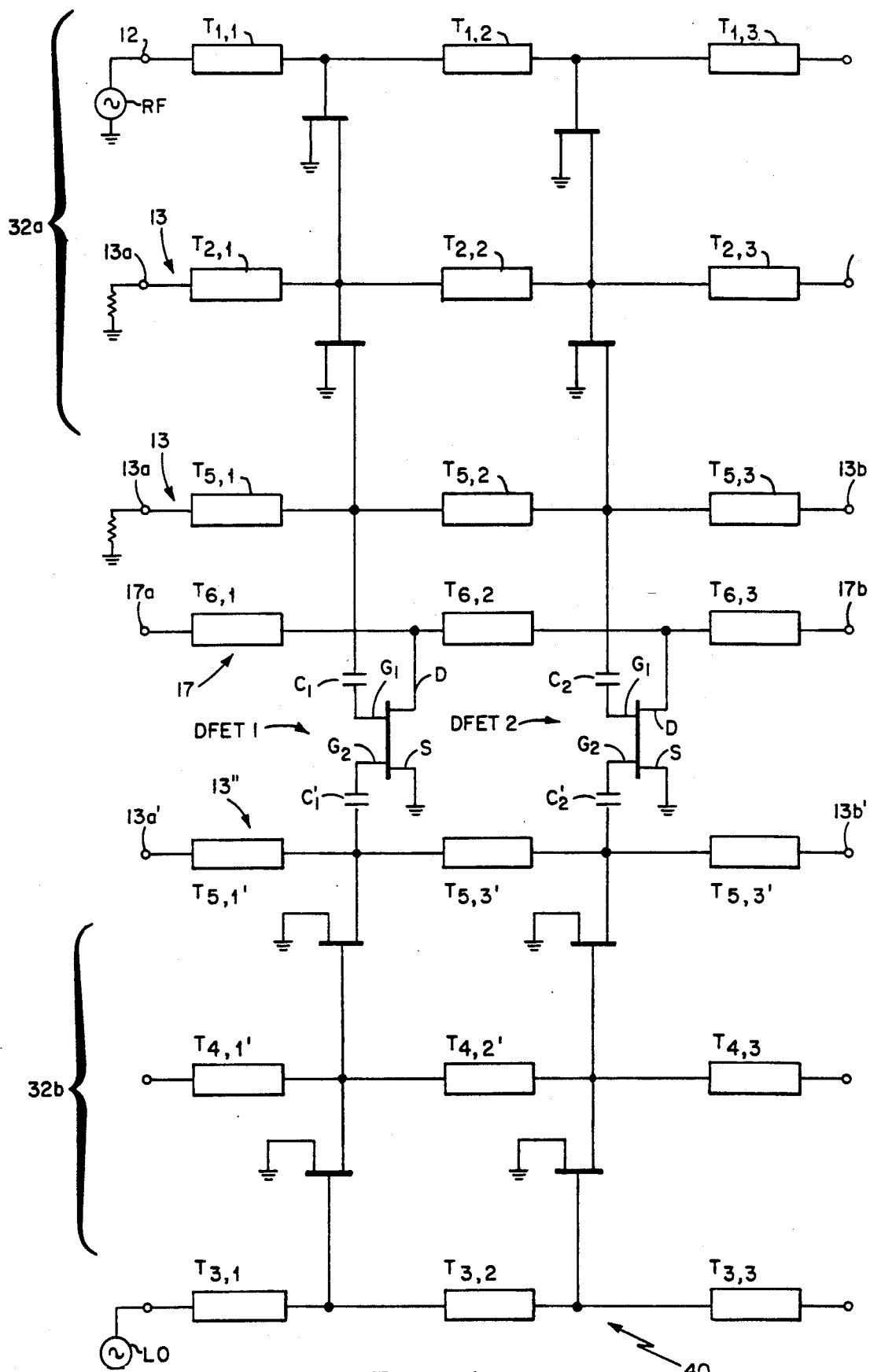
FIG. 4 is a schematic diagram of a matrix mixer having RF and LO matrix preamplifiers each matrixed with a plurality of dual-gate field effect transistors.

Referring now to FIG. 4, a further alternate embodiment of a matrix mixer 40 is shown to include the pair of matrix amplifiers 32a, 32b for signals $V_{RF}$, $V_{LO}$ respectively, as generally described in conjunction with FIG. 3. Here, however, said amplifiers 32a, 32b are coupled to one of a pair of intermediate propagation networks 13 (as generally described above) and 13'. Here network 13 is comprised of transmission line sections $T_{5,1}$-$T_{5,3}$ as mentioned and network 13' is comprised of transmission line sections $T_{5,1'}$-$T_{5,3'}$.

Here mixer 40 is shown having only two successively coupled elements in each stage thereof. However, more than two of such elements as shown in the preceding figures may alternatively be used.

Here said pair of matrixed amplifiers 32a, 32b are matrixed to a plurality of mixer elements, here said mixer elements being dual-gate field effect transistors (DFET 1-DFET 2) each having a pair of input or gate electrodes $G_1$, $G_2$, an output or drain electrode D, and a reference or source electrode S. Here gate electrodes $G_1$ are successively coupled by the first intermediate propagation network 13, and gate electrodes $G_2$ are successively coupled by the second intermediate propagation network 13', as shown. Thus, signals $V_{RF}$ and $V_{LO}$ are fed separately to the dual-gate field effect transistors. The drains of the dual-gate field effect transistors DFET 1- DFET 2 are successively coupled by the output propagation network 17 comprised of transmission line sections $T_{6,1}$-$T_{6,3}$ as also shown. Due to the high degree of gate to gate isolation afforded by the dual-gate FET, the degree of isolation between the output terminal 17b and either one of the input terminals 12, as well as, the isolation between either pair of input terminals 11a, 12a will be relatively high and in particular such a circuit would be well suited for mixer applications requiring a high degree of LO to RF isolation.

Figure 5:
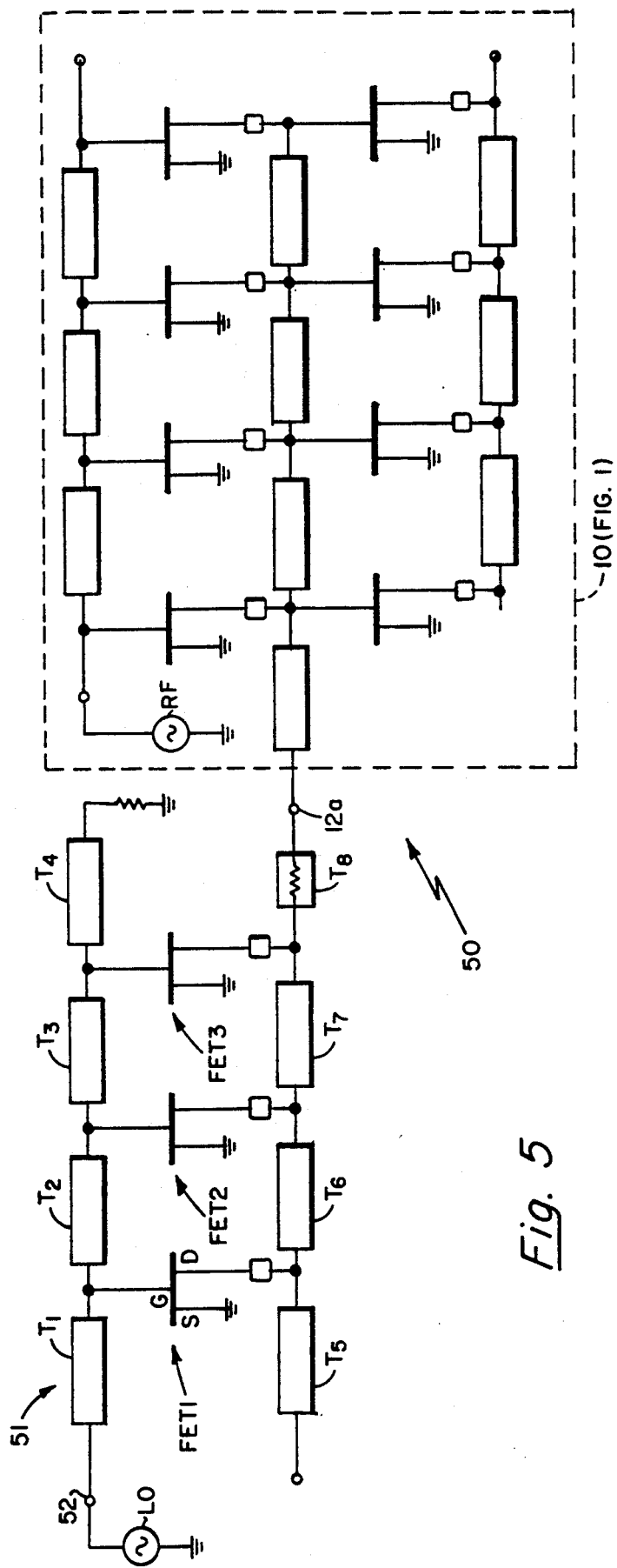
FIG. 5 is a schematic representation of a matrix mixer according to FIG. 1 having an alternate technique for providing high RF to LO isolation and LO preamplification.

Referring now to FIG. 5, an alternate embodiment of a matrix mixer 50 having RF and LO distributed amplification, but having a simpler layout than that described in conjunction with FIG. 2 is shown to include the mixer 10 of FIG. 1, and a distributed amplifier 51 used to amplify the local signal $V_{LO}$. Amplifier 51 includes an input propagation network comprised of transmission line sections $T_1$-$T_4$ and an output propagation network comprised of transmission line sections $T_5$-$T_7$ with the end of transmission line $T_7$ being connected to terminal 13a and the transmission line section $T_{5,1}$ of the network 13, as generally described in conjunction with FIG. 1. A plurality of here three field effect transistors FET 1 -FET 3 are used to successively couple portions of the input signal fed along transmission line sections $T_1$-$T_4$ to the respective field effect transistors FET 1-FET 3 producing output signals which are successively coupled, and propagate along transmission line sections $T_5$-$T_8$ towards the transmission line section $T_{5,1}$ at terminal 17a, as will now be generally understood.

Thus, an amplified version of the local oscillator signal $V_{LO}$ is fed to the matrix mixer 10 of FIG. 1. This particular arrangement obviates the need for a filter at the input terminal of the mixer of FIG. 1 to isolate the RF signal from the LO signal and, furthermore, provides gain to the LO signal, thus, increasing the conversion efficiency of the mixer 50. This arrangement may be easier to implement as a monolithic microwave integrated circuit than the implementation shown in FIG. 2, since there is no need for crossovers to couple the LO amplifier stage and the RF amplifier stage to the matrix mixer elements.

Figure 6:
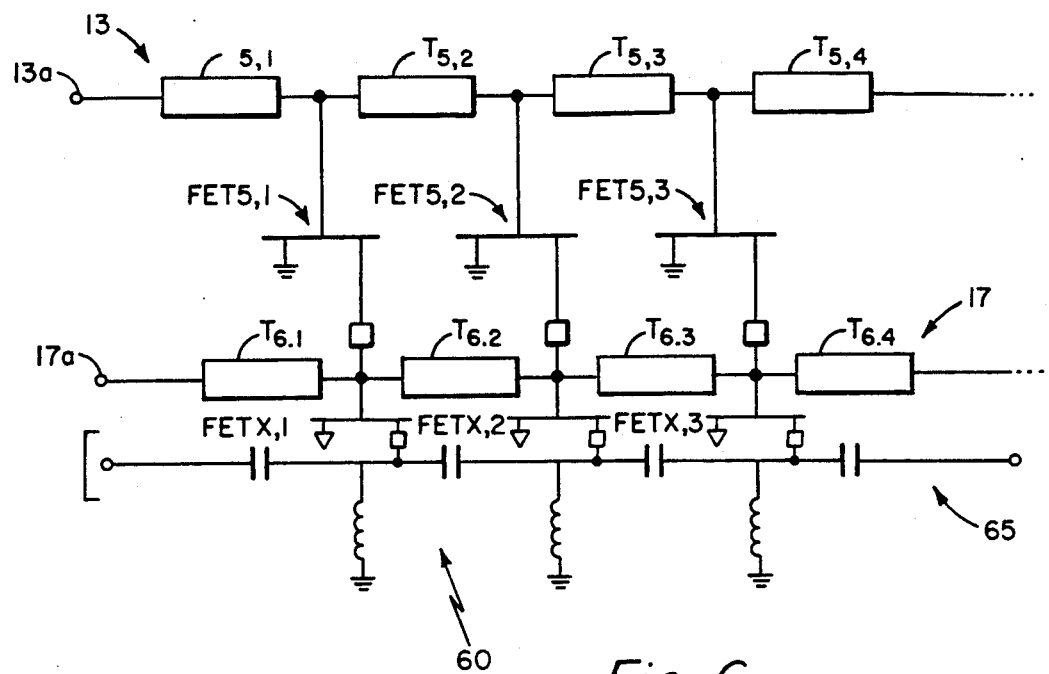
FIG. 6 is a schematic representation of a matrixed mixer, having a transversal filter for IF filtering.

Referring now to FIG. 6, a further embodiment of a matrix mixer 60 is shown to include the matrix mixer non-linear elements FET 5,1-FET 5,3 as generally described above in conjunction with FIGS. 1-5 being fed by composite signals RF, LO which may be provided, for example, from matrixed amplifiers configured, as generally described in conjunction with FIGS. 1-5 or may be fed by other means. The mixer input network 13 is matrixed with a transversal filter 65 comprised of the output propagation network 17, as generally described in conjunction with FIGS. 1-5, and a second output propagation network 65 here a phase advance, lumped element network comprised of series connected capacitors and shunt connected inductors, as generally shown. The transversal elements of the transversal filter are here provided by field effect transistors FET X,1 -FET X,3, said transistors having selective weights or gains which when IF signals are fed thereto provide in combination with the network 17 and the network 65 a predetermined passband characteristic. Thus, this arrangement may be used to provide mixer 60 with a well-defined IF passband.

Preferred examples of transversal filters suitable for use as the transversal filter 65 in the matrix mixer 60 of FIG. 6 are described in U.S. Pat. No. 5,021,756 by Tajima et al. incorporated herein by reference and assigned to the assignee of the present invention. The use of the transversal filter matrixed with the matrix amplifier provides compact IF filtering, which suppresses spurious signals and minimize harmonic saturation at succeeding linear circuits.

Figure 7:
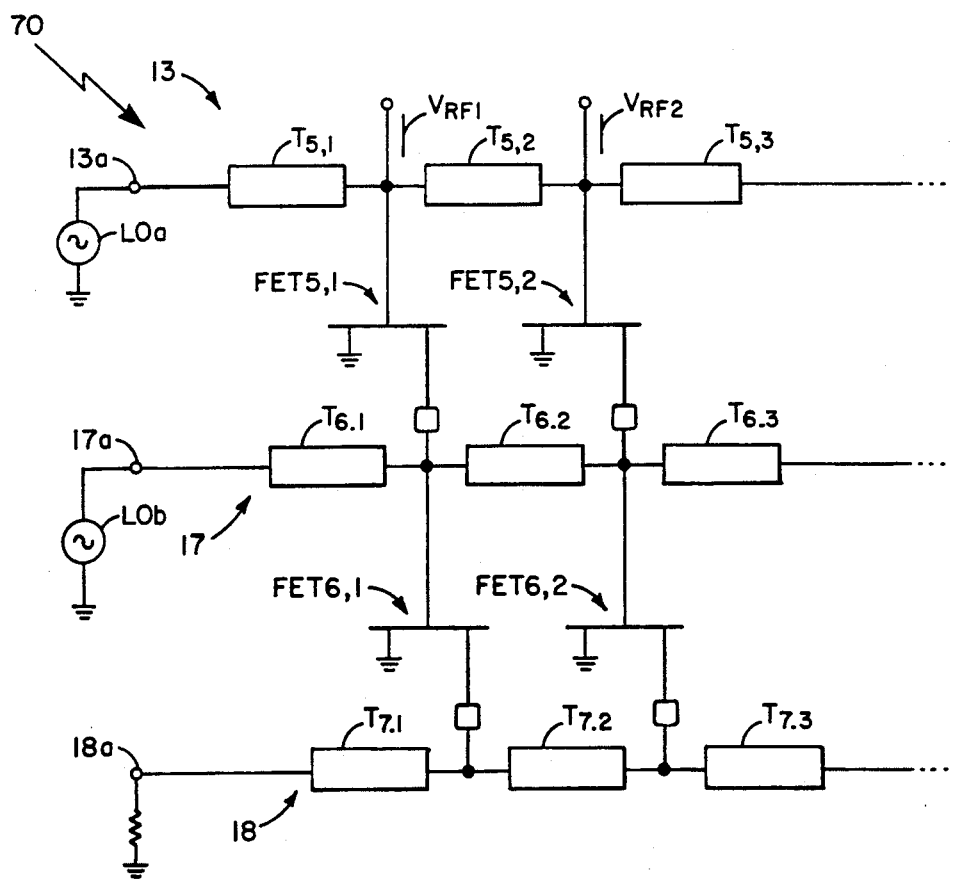
FIG. 7 is a schematic representation of a double downconverter in accordance with a further aspect of the present invention.

Referring now to FIG. 7, a further alternate embodiment of the present invention, a multiple downconverter 70, which provides a plurality of intermediate frequency signal conversions to input signal $V_{RF}$ by using a corresponding plurality of different, local oscillator signals $V_{LOa}$ and $V_{LOb}$ is shown. Such a circuit 70 is commonly employed in receivers requiring multiple down-conversions. Multiple downconversions are often used to reduce spurious signals in the IF band. Alternatively, multiple down conversions are often used to efficiently convert to a relatively low IF frequency.

Here signal $V_{RF1}$, $V_{RF2}$ is matrixly fed to the first plurality of mixer elements FET 5,1–FET 5,2 as generally described in conjunction with FIGS. 1–6. Such signals $V_{RF1}$, $V_{RF2}$ are successively coupled to the intermediate propagation network 13, as also generally described above.

A first local oscillator signal here $V_{LO1}$ is fed to terminal 13a and is coupled to the intermediate propagation network 13. Said signals $V_{RF}$ and $V_{LO}$ are down converted by transistors FET 5,1–FET 5,2 to provide a first conversion $|\omega_{RF} \pm \omega_{LOa}|$ providing a first IF frequency $\omega_{IF1}$.

The output electrodes of transistors FET 5,1–FET 5,2 are successively coupled by network 17, as generally described above. Here, however, network 17 also serves to successively couple the input or gate electrodes of a succeeding stage of matrix mixer elements here FET 6,1–FET 6,2 as shown. Generally both ends of line 17 are terminated in a matching impedance. The IF signals are fed to the second matrixed mixer stage. A second signal $V_{LOb}$ is also fed to the inputs of mixer elements FET 6,1 to FET 6,2. In response a second frequency conversion $|\omega_{IF} \pm \omega_{LOb}|$ is provided at terminal 18b to provide the second IF frequency signal $\omega_{IF2}$. Terminal 18a is here terminated in a matching impedance as in FIG. 1. Alternatively, one or more stages of distributed amplification may be disposed between the matrixed mixer stages.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

We claim:

1. A radio frequency, matrixed frequency conversion circuit, having a first input terminal and an output terminal, comprises:
    an input propagation network coupled to the first input terminal;
    a first plurality of transistors having input electrodes and output electrodes, said input electrodes being successively coupled by said input propagation network;
    an intermediate propagation network successively coupling said output electrodes of the first plurality of transistors;
    a first plurality of non-linear elements, each element having an input electrode and an output electrode, said input electrodes being successively coupled by said intermediate propagation network; and
    a third propagation network successively coupling said output electrodes of said first plurality of non-linear elements to the output terminal of the circuit.

2. The circuit of claim 1, wherein said circuit is a frequency multiplier, and wherein an input signal having a fundamental frequency is fed to the first input terminal and is matrixly fed form said first plurality of transistors to said elements to provide a signal having a harmonic frequency at the output of each one of said non-linear elements, with said signals being coupled to the output terminal of the circuit to provide a composite output signal having a frequency, which is harmonic of said fundamental frequency.

3. The circuit of claim 2, wherein the first plurality of transistors are field effect transistors and the first plurality of non-linear elements are field effect transistors operated as non-linear elements.

4. The circuit of claim 1, wherein said circuit is a mixer and has a second input terminal coupled to the intermediate propagation network.

5. The circuit of claim 4, wherein the first plurality of transistors are field effect transistors and the first plurality of non-linear elements are field effect transistors operated as non-linear elements.

6. The circuit of claim 5, further comprising:
    at least one transistor having a selected gain characteristics, an input electrode and an output electrode, the input electrode being successively coupled by the output propagation network; and
    a lumped element network having a first end coupled to the output terminal of the circuit successively coupling the output electrode of each of said at least one transistor, with said output propagation network, said gain characteristic of the at least one transistor, and said lumped element network selected to provide a predetermined passband frequency characteristic to the circuit.

7. The radio frequency circuit of claim 1 further comprising:
    a second input propagation network coupled to a second input terminal of the circuit;
    a second plurality of field effect transistors having input electrodes and output electrodes, said input electrodes being successively coupled by said second input propagation network; and
    wherein said output electrodes of said second plurality of field effect transistors and the output electrodes of the first plurality of field effect transistors are successively coupled by the intermediate propagation network.

8. The circuit of claim 1, wherein each one of said propagation networks include microstrip transmission line.

9. The circuit of claim 1, further comprising a distributed amplifier having an input terminal and an output terminal, with said output terminal being coupled between a second input terminal of the circuit and the intermediate propagation network.

10. A matrix mixer fed by an input signal $V_{RF}$ and a local oscillator signal $V_{LO}$ at a pair of respective input terminals thereof, to provide an output signal $V_{IF}$ at an output terminal thereof comprises:
- a first preamplifier fed by $V_{RF}$ comprising:
  - at least one stage of a distributed radio frequency amplifier, comprising:
  - an input propagation network having a first end coupled to the first input terminal of the network; and
  - a plurality of field effect transistors, with the input electrodes of said plurality of field effect transistors being successively coupled by said input propagation network;
- a second preamplifier fed by signal $V_{LO}$, comprising:
  - at least one stage of a distributed radio frequency amplifier, comprising:
  - an input propagation network having a first and coupled to the second input terminal of the network; and
  - a plurality of field effect transistors, with the input electrodes of said plurality of field effect transistors being successively coupled by said input propagation network; and
  - means for successively coupling the output electrodes of the transistors of said RF preamplifier and said LO preamplifier; and
  - mixer means including a plurality of non-linear devices having input electrodes successively coupled by said means for successively coupling output electrodes for providing the IF signal having a frequency component related to $|\pm\omega_{RF}\pm\omega_{LO}|$, where $\omega_{RF}$ is the frequency of the signal RF and $\omega_{LO}$ is the frequency of the signal LO.

11. The mixer, as recited in claim 10, wherein said plurality of non-linear elements of said mixer means includes a plurality of dual-gate field effect transistors FETS, and said means for successively coupling output electrodes includes:
- a pair of propagation networks, a first propagation network successively coupling first gate electrodes of said plurality of dual-gate FETS with output electrodes of the transistors of the RF preamplifier, and a second one of said propagation networks successively coupling second gate electrodes of said plurality of dual-gate FETS with output electrodes of the transistors of the LO preamplifier; and
  wherein said mixer means further includes:
- an output coupling means for successively coupling the output electrodes of each one of said plurality of dual-gate field effect transistors to the output terminal of the mixer.

12. The mixer, as recited in claim 10, wherein said means for successively coupling includes an intermediate propagation network successively coupling the output electrodes of a succeeding one of said stages of RF preamplification with the output electrodes of succeeding stage of said LO preamplification; and
  wherein said mixer means has said plurality of non-linear elements with said input electrodes being successively coupled by said intermediate propagation network; and
  an output propagation network successively coupling the output electrodes of said non-linear elements to the output terminal of the mixer.

13. The mixer of claim 10, wherein each preamplifier includes a plurality of stages of said distributed amplifier with a succeeding stage of such preamplifier having the input propagation network thereof successively coupled by the output electrodes of the transistors of the preceding stage of said preamplifier.

14. The mixer, as recited in claim 13, wherein said plurality of non-linear elements of said mixer means includes a plurality of dual-gate field effect transistors (FETS), and said means for successively coupling output electrodes includes:
- a pair of propagation networks, a first propagation network successively coupling first gate electrodes of said plurality of dual-gate FETS with output electrodes of the transistors of the RF preamplifier, and a second one of said propagation networks successively coupling second gate electrodes of said plurality of dual-gate FETS with output electrodes of the transistors of the LO preamplifier; and
  wherein said mixer means further includes:
- an output coupling means for successively coupling the output electrodes of each one of said plurality of dual-gate field effect transistors to the output terminal of the mixer.

15. The mixer, as recited in claim 13, wherein said for successively coupling includes an intermediate propagation network successively coupling the output electrodes of the succeeding one of said stages of the RF preamplification with the output electrodes of succeeding one of said stages of said LO preamplification; and
  wherein said mixer means has said plurality of non-linear elements with said input electrodes being successively coupled by said intermediate propagation network; and
  an output propagation network successively coupling the output electrodes of said non-linear elements to the output terminal of the mixer.

* * * * *